(12) United States Patent
Kim et al.

(10) Patent No.: US 10,532,713 B2
(45) Date of Patent: Jan. 14, 2020

(54) OCCUPANT CLASSIFICATION APPARATUS FOR VEHICLE

(71) Applicants: Hyundai Motor Company, Seoul (KR); Tyco Electronics AMP Korea Co., Ltd., Gyeongsan, Gyeongsangbuk-Do (KR)

(72) Inventors: Nam Gyun Kim, Incheon (KR); Chun Seok Park, Gyeonggi-Do (KR); Kwang Ho Song, Incheon (KR)

(73) Assignee: Hyundai Motor Company, Seoul (KR)

( * ) Notice: Subject to any disclaimer, the term of this patent is extended or adjusted under 35 U.S.C. 154(b) by 165 days.

(21) Appl. No.: 15/226,173

(22) Filed: Aug. 2, 2016

(65) Prior Publication Data

US 2017/0166153 A1 Jun. 15, 2017

(30) Foreign Application Priority Data

Dec. 9, 2015 (KR) .................. 10-2015-0174792

(51) Int. Cl.
| | |
|---|---|
| B60R 21/015 | (2006.01) |
| G01R 31/00 | (2006.01) |
| G01R 29/26 | (2006.01) |
| B60N 2/00 | (2006.01) |
| G01G 19/414 | (2006.01) |
| G01R 19/00 | (2006.01) |
| B60R 21/01 | (2006.01) |

(52) U.S. Cl.
CPC ........ B60R 21/01524 (2014.10); B60N 2/002 (2013.01); B60R 21/0153 (2014.10); G01R 29/26 (2013.01); G01R 31/001 (2013.01); *B60R 2021/01286* (2013.01); *G01G 19/4142* (2013.01); *G01R 19/0007* (2013.01)

(58) Field of Classification Search
CPC ......... B60R 21/01524; B60R 21/0153; B60R 2021/01286; G01R 31/001; G01R 29/26; B60N 2/002; G01G 19/4142
See application file for complete search history.

(56) References Cited

U.S. PATENT DOCUMENTS

| | | |
|---|---|---|
| 6,161,070 A | 12/2000 | Jinno et al. |
| 6,646,452 B2 | 11/2003 | Lester |
| 7,135,983 B2 | 11/2006 | Filippov et al. |

(Continued)

FOREIGN PATENT DOCUMENTS

| | | |
|---|---|---|
| EP | 2353946 A1 | 8/2011 |
| JP | 2001174567 A | 6/2001 |

(Continued)

*Primary Examiner* — Huy Q Phan
*Assistant Examiner* — Zannatul Ferdous
(74) *Attorney, Agent, or Firm* — Mintz Levin Cohn Ferris Glovsky and Popeo, P.C.; Peter F. Corless

(57) ABSTRACT

The present invention provides an occupant classification apparatus for a vehicle. The occupant classification apparatus for a vehicle includes a sensor mat that is mounted on each seat in the vehicle to sense objects disposed on the seats. An impedance measurer is configured to measure a current based on impedance of the object using the sensor mat A controller is configured to analyze the current measured by the impedance measurer and estimate the object that corresponds to the analyzed result.

15 Claims, 7 Drawing Sheets

(56) References Cited

U.S. PATENT DOCUMENTS

| | | | |
|---|---|---|---|
| 8,049,520 B2* | 11/2011 | Schleeh | B60R 21/01532 |
| | | | 177/144 |
| 8,237,455 B2 | 8/2012 | Griffin | |
| 8,258,932 B2 | 9/2012 | Wahlstrom | |
| 9,651,407 B2* | 5/2017 | Mourey | G01D 11/00 |
| 2005/0131607 A1* | 6/2005 | Breed | B60N 2/002 |
| | | | 701/45 |
| 2006/0267321 A1 | 11/2006 | Harish et al. | |
| 2009/0001976 A1* | 1/2009 | Cech | B60R 21/0134 |
| | | | 324/228 |
| 2009/0027221 A1* | 1/2009 | Plocher | G01G 19/4142 |
| | | | 340/667 |
| 2009/0092284 A1* | 4/2009 | Breed | B60J 10/00 |
| | | | 382/103 |
| 2010/0060425 A1* | 3/2010 | Rodriguez | H04Q 9/00 |
| | | | 340/10.1 |
| 2011/0029203 A1 | 2/2011 | Watson et al. | |
| 2011/0121797 A1* | 5/2011 | Daniel | H02M 3/1563 |
| | | | 323/265 |
| 2013/0027065 A1* | 1/2013 | Stanley | B60N 2/002 |
| | | | 324/705 |
| 2013/0181942 A1* | 7/2013 | Bulea | G06F 3/044 |
| | | | 345/174 |

FOREIGN PATENT DOCUMENTS

| | | |
|---|---|---|
| JP | 3719112 B2 | 11/2005 |
| JP | 2014-030483 A | 2/2014 |
| JP | 5415110 B2 | 2/2014 |
| KR | 10-2012-0003175 A | 1/2012 |

\* cited by examiner

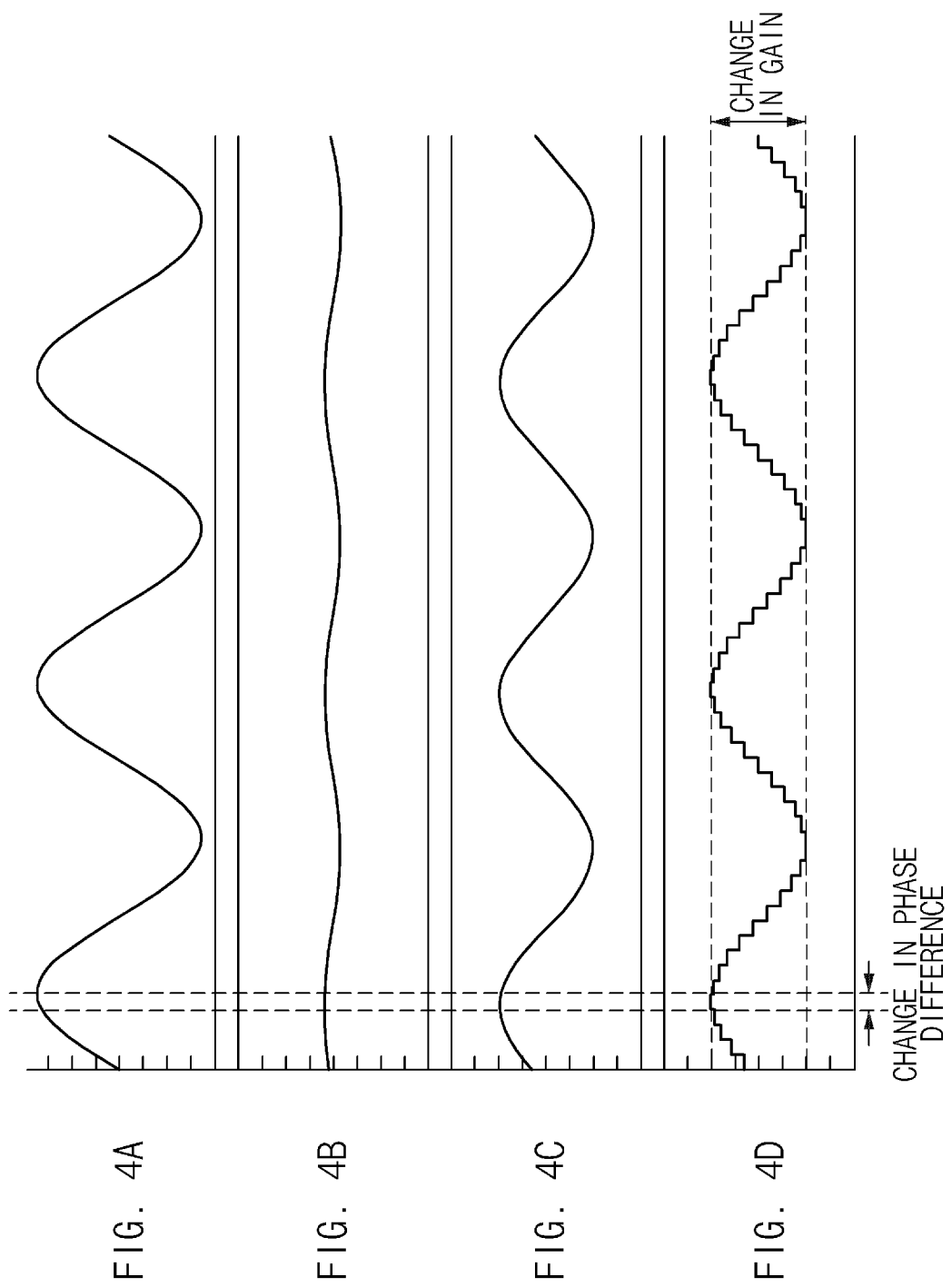

OCCUPANT CLASSIFICATION APPARATUS FOR VEHICLE

CROSS-REFERENCE TO RELATED APPLICATION

This application is based on and claims the benefit of priority to Korean Patent Application No. 10-2015-0174792, filed on Dec. 9, 2015 in the Korean Intellectual Property Office, the disclosure of which is incorporated herein in its entirety by reference.

BACKGROUND

Technical Field

The present disclosure relates to an occupant classification apparatus for a vehicle, and more particularly, to an occupant classification apparatus for a vehicle capable of classifying objects robustly located on a seat against electromagnetic wave interference and a change in surrounding environment.

Description of Related Art

Generally, an occupant classification system (OCS) is a system of that classifies an occupant by measuring a load applied to a seat. The occupant classification system includes individual sensor mats embedded in each seat. The sensor mat measures a pressure distribution and monitors a passenger (e.g., occupant) state to transfer the corresponding information to an airbag control apparatus. When an airbag and a seat belt retractor are engaged, the results of the classification of an occupant classification apparatus are considered to deploy the airbag.

The above information disclosed in this section is intended merely to aid in the understanding of the background of the invention and therefore it may contain information that does not form the prior art that is already known in this country to a person of ordinary skill in the art.

SUMMARY

An aspect of the present disclosure provides an occupant classification apparatus for a vehicle capable of classifying objects disposed on seats by measuring impedance using a Fourier transform. Another aspect of the present disclosure provides an occupant classification apparatus for a vehicle capable of monitoring noise based on electromagnetic wave interference and a change in environment by periodically adjusting a gain and a frequency of power to avoid the electromagnetic wave interference and changes in environment.

According to an exemplary embodiment of the present disclosure, an occupant classification apparatus for a vehicle may include a sensor mat disposed at each seat within the vehicle and configured to sense objects disposed on the seats, an impedance measurer configured to measure a current based on impedance of the object using the sensor mat and a controller configured to analyze the current measured by the impedance measurer and estimate the object that corresponds to the analyzed result.

The sensor mat may include a first electrode and a second electrode installed to overlap with each other in a vertical direction and to generate an electric field by alternating current (AC) power. Alternatively, the first electrode and the second electrode may be formed of a similar shape and material. The first electrode and the second electrode may be formed of different shapes and materials. The impedance measurer may include a power supplier configured to generate AC power, a measurer applied in conjunction with the AC power and configured to measure the current based on the impedance of the object and an operator configured to convert a signal measured by the measurer into a frequency domain by Fourier transform to operate a first value (e.g., a real value or an experimental value) and a second value (e.g., a theoretical value or an estimated value) of the measured signal.

The power supplier may include a clock generator configured to generate a clock signal, a direct digital synthesizer configured to generate a digital waveform signal based on the clock signal, a digital-to analog converter configured to convert the digital waveform signal into an analog waveform signal, a gain changer configured to change a gain of the analog waveform signal and a first voltage biasing unit configured to apply a bias voltage to an analog waveform signal output from the gain changer. The measurer may include an impedance unit configured to measure the current based on the impedance of the object, a differential amplifier configured to amplify a voltage applied to terminals of the impedance unit and a comparator configured to form the first electrode and the second electrode of the sensor mat at similar potential. The comparator may include a voltage follower.

The operator may include a second voltage biasing unit configured to re-bias a signal biased by a first voltage biasing unit to extract an AC component, an analog to digital converter configured to convert the analog signal re-biased by the second voltage biasing into the digital waveform signal, a Fourier transformer configured to transform the digital waveform signal into a frequency domain, a first register configured to store a first value output from the Fourier transformer, a second register configured to store a second value output from the Fourier transformer and an interface configured to transmit the first value and the second value stored in the first register and the second register to the controller. The operator may further include a temperature sensor configured to measure current peripheral temperature and the Fourier transformer may be configured to correct a distortion of the first value and the second value based on the peripheral temperature.

The Fourier transformer may be implemented as fast Fourier transformation. The Fourier transformer may be implemented as discrete Fourier transform. The controller may be configured to periodically adjust a frequency and a gain of the AC power to monitor for the occurrence of abnormality due to electromagnetic wave interference and noise to change an operation state. The operation state may be any one of a normal operation state, a temporary interference and noise state, and an abnormal operation state. The controller may be configured to output a default value or a preliminary classification value as a classification value for the object, when the operation state is in the temporary interference and noise state.

BRIEF DESCRIPTION OF THE DRAWINGS

The above and other objects, features and advantages of the present disclosure will be more apparent from the following detailed description when taken in conjunction with the accompanying drawings.

FIG. 4A to 4D is an exemplary graph for describing an occupant classification principle according to an exemplary embodiment of the present disclosure;

DETAILED DESCRIPTION

Figure 1:
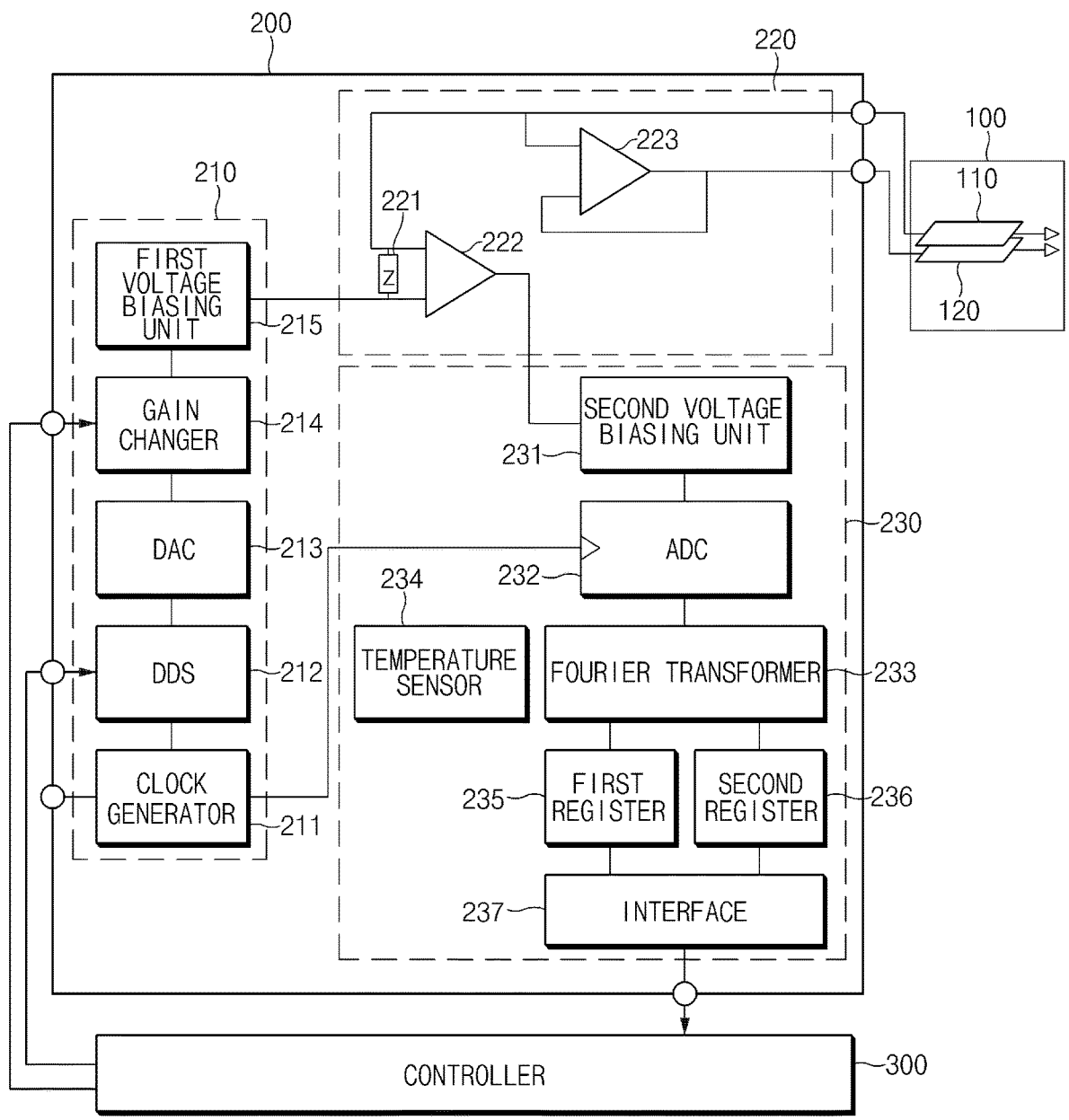
FIG. 1 is an exemplary block configuration diagram of an occupant classification apparatus for a vehicle according to an exemplary embodiment of the present disclosure.

Hereinafter, exemplary embodiments of the present disclosure will be described with reference to the accompanying drawings. It is to be noted that in giving reference numerals to components of each of the accompanying drawings, the same components will be denoted by the same reference numerals even though they are shown in different drawings Further, in describing exemplary embodiments of the present disclosure, well-known constructions or functions will not be described in detail in the case in which they may unnecessarily obscure the understanding of the exemplary embodiments of the present disclosure.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, in order to make the description of the present invention clear, unrelated parts are not shown and, the thicknesses of layers and regions are exaggerated for clarity. Further, when it is stated that a layer is "on" another layer or substrate, the layer may be directly on another layer or substrate or a third layer may be disposed therebetween.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about".

It is understood that the term "vehicle" or "vehicular" or other similar term as used herein is inclusive of motor vehicle in general such as passenger automobiles including sports utility vehicles (SUV), buses, trucks, various commercial vehicles, watercraft including a variety of boats, ships, aircraft, and the like and includes hybrid vehicles, electric vehicles, combustion, plug-in hybrid electric vehicles, hydrogen-powered vehicles and other alternative fuel vehicles (e.g. fuels derived from resources other than petroleum).

The present disclosure provides an estimate related to objects disposed on an upper surface of a seat by considering each object of a person, an object, or the like has a unique impedance value. In other words, the present disclosure measures impedance values (e.g., impedance) of the objects disposed on the upper surface of the seat and classifies (e.g., identifies) the objects based on a threshold range of the measured impedance. The threshold range may be set for each object and may be predetermined via generated in a lookup table form.

Figure 2:
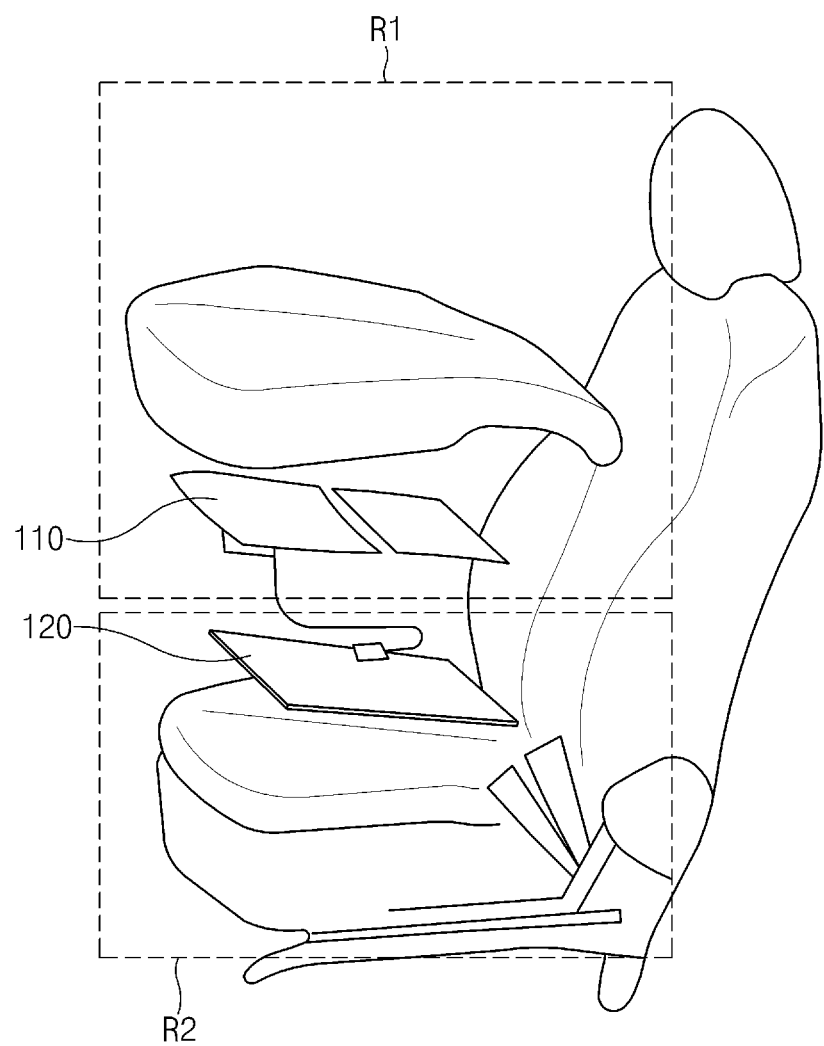
FIG. 2 is an exemplary diagram for describing an installation structure of a sensor mat illustrated in FIG. 1 according to an exemplary embodiment of the present disclosure.
Figure 3A:
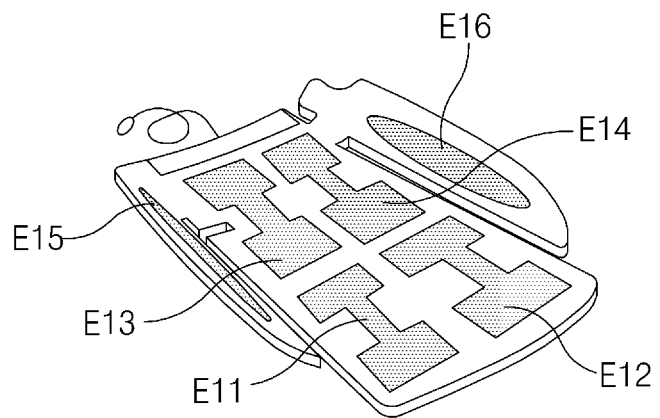
FIGS. 3A and 3B are exemplary diagrams for describing a structure of multiple pole plates of the sensor mat illustrated in FIG. 1 according to an exemplary embodiment of the present disclosure.
Figure 3B:
Figure 5:
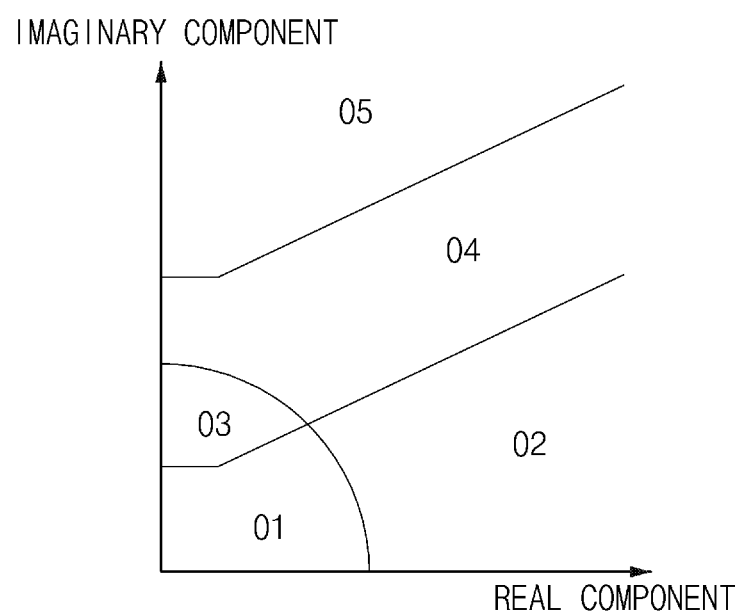
FIG. 5 is an exemplary graph illustrating a threshold range for occupant classification of the occupant classification apparatus for a vehicle according to the exemplary embodiment of the present disclosure.
Figure 6:
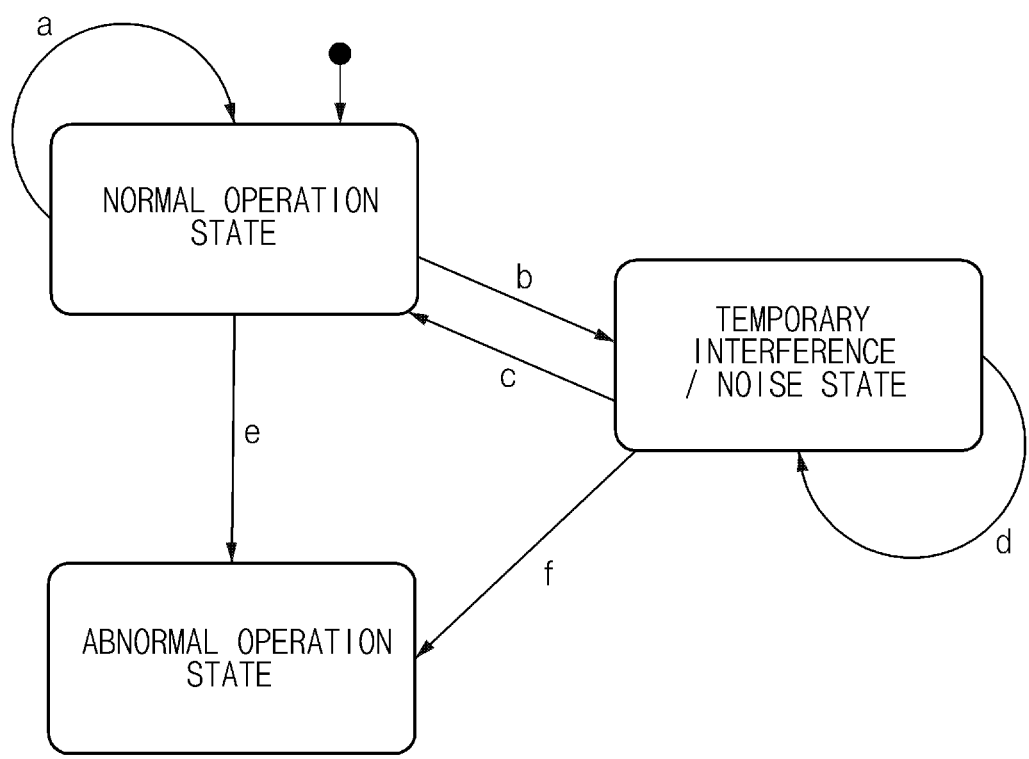
FIG. 6 is an exemplary operation state diagram of a fail-safe function of the occupant classification apparatus for a vehicle according to the exemplary embodiment of the present disclosure.

FIG. 1 is an exemplary block configuration diagram of an occupant classification apparatus for a vehicle according to an exemplary embodiment of the present disclosure. FIG. 2 is an exemplary diagram that describes an installation structure of a sensor mat illustrated in FIG. 1. FIGS. 3A and 3B are exemplary diagrams that describe a structure of multiple pole plates of the sensor mat illustrated in FIG. 1. FIG. 4A to 4D is an exemplary graph that describes an occupant classification principle based on an exemplary embodiment of the present disclosure. FIG. 5 is an exemplary graph illustrating a threshold range for occupant classification of the occupant classification apparatus for a vehicle according to the exemplary embodiment of the present disclosure. FIG. 6 is an exemplary operation state diagram of a fail-safe function of the occupant classification apparatus for a vehicle according to the exemplary embodiment of the present disclosure.

As illustrated in FIG. 1, the occupant classification apparatus for a vehicle may include a sensor mat 100, an impedance measurer 200, and a controller 300. For example, the controller may be configured to operate the various components or units of the apparatus. The sensor mat 100 may be mounted in each seat to sense when passengers enter into a vehicle. The sensor mat 100 may be configured to sense the objects (e.g., person, object, or the like) disposed on the upper surface of the seat. The sensor mat 100 may include a first electrode 110 and a second electrode 120 which are electrically coupled to each other and disposed to overlap with each other in a vertical direction. The first electrode 110 and the second electrode 120 may be configured to generate an electric field via AC power. The first electrode 110 and the second electrode 120 may be formed of a similar shape and material or may be formed of different shapes and materials For example, the first electrode 110 and the second electrode 120 may be formed from materials such as steel and foil.

As illustrated in FIG. 2, the sensor mat 100 may be divided into an impedance measuring area R1 and an impedance guarding area R2. The impedance measuring area R1 may include an area in which an electric field in a first direction of the first electrode 110 measures the impedance values of the objects on the upper surface of the seat. Conversely, the impedance guarding area R2 may include an area that generates the electric field of the second electrode 120 and the electric field in the first direction of the second electrode 120 terminates an electric field in a second direction of the first electrode. In particular, that the electric field in the first direction of the first electrode 110 may have directivity in the first direction. For example, the first direction indicates a vertically upward direction toward a seat cushion based on the first electrode 110 and the second electrode 120 and the second direction indicates a vertically downward direction opposite to 180° with respect to the first direction.

According to the exemplary embodiment of the present disclosure, the first electrode 110 and the second electrode 120 may be configured to have similar potential, for example, the electric field in the first direction of the second electrode 120 may terminate the electric field in the second direction of the first electrode 110. Alternatively, the first electrode 110 and the second electrode 120 may be configured to have a minimal, constant potential difference. Accordingly, the electric field in the second direction of the first electrode 110 may minimally impact the measurement value.

The sensor mat 100 may include multiple electrodes E11 to E16 as illustrated in FIG. 3A configured sense a plurality of postures of an occupant. For example, the occupant classification apparatus according to the exemplary embodiment of the present disclosure may use a pattern and a difference between a first value and an second value of a signal sensed by the plurality of electrodes to sense a type of object and a posture of the objects. For the sensor mat 100 to sense a size of the object on the seat, as illustrated in FIG. 3B, a plurality of electrodes E21 to E23 may be disposed in a back of the seat and the seat cushion. For example, the electrode E21 may be configured to sense a body part of an occupant and the electrodes E22 and E23 may be configured to sense a hip portion and a calf portion, respectively.

The impedance measurer 200 may be configured to measure the impedance of the object (hereinafter, occupant) on the seat using the sensor mat 100. The impedance measurer 200 may include a power supplier 210, a measurer 220, and an operator 230. The power supplier 210 may be configured to generate alternating power (e.g., sinusoidal voltage) and may include a clock generator 211, a direct digital synthesizer (DDS) 212, a digital to analog converter (DAC) 213, a gain changer 214, and a first voltage biasing unit 215.

The clock generator 211 may be configured to generate a clock signal required to operate internal elements of an impedance measurer 200. For example, similar to a crystal oscillator, the clock generator 211 may be implemented as an internal clock having a constant oscillation effect of frequency or a clock of an external element for synchronization with the external element when a substantively constant voltage is applied to both terminals thereof. The direct digital synthesizer 212 may be configured to generate a stored digital signal waveform by a scheme that outputs a digital value stored therein in response to receiving the fixed number of clocks from the clock generator 211. The direct digital synthesizer 212 may be configured to include a counter (CNT) and a read only memory (ROM). In particular, the counter (CNT) may be configured to receive a clock signal and increase counting numbers when the fixed number of clocks is applied. The counter may apply the counting numbers to address values of the ROM to output the values in order stored in the address values from the ROM, and may generate a waveform.

When the controller 300 orders (e.g., requests) a change in the number of clocks which is a reference by which the counter may be configured to change the counting numbers, the direct digital synthesizer 212 may be configured to change the counting numbers in response to receiving the number of clocks changed based on the order. In other words, the direct digital synthesizer 212 may be configured to adjust a frequency of an output signal based on a periodic frequency adjustment command of the controller 300. Further, when the direct digital synthesizer 212 receives the frequency adjustment command from the controller 300, the direct digital synthesizer 212 may be configured to diagnose the problem of electromagnetic wave interference and noise of the occupant classification apparatus and the change in environment.

The DAC 213 may be configured to convert a digital waveform signal output from the direct digital synthesizer 212 into an analog waveform signal. The DAC 213 may include an R2R ladder may be configured to convert a voltage signal having a digital waveform into a voltage signal having an analog waveform and a low pass filter (LPF) may be configured to filter the voltage signal output from the R2R ladder to smoothly process the voltage signal. The gain changer 214 may be configured to adjust a size of gain of the analog signal converted by the DAC 213. The gain changer 214 may be configured to include an inverting gain circuit or a non-inverting gain circuit using an OP-AMP. The gain changer 214 may be configured to determine variation of the size of gain based on the control command of the controller 300 to adjust the gain of the output signal. The gain changer 214 may be configured to diagnose the electromagnetic wave interference and the noise and the change in environment along with the direct digital synthesizer 212.

The first voltage biasing unit 215 may be configured to apply a bias voltage to a voltage signal output from the gain changer 214 to output a sinusoidal voltage. The first voltage biasing unit 215 may be configured to supply the sinusoidal voltage to the measurer 220. The first voltage biasing unit 215 may be configured to output an analog voltage signal biased as much as Vdd/2 to prevent the measurer 220 which is an active circuit from burning For example, as illustrated in FIG. 4A, the first voltage biasing unit 215 may be configured to output the biased sinusoidal voltage. The first voltage biasing unit 215 may be configured to apply the sinusoidal voltage to a terminal of an input side of a differential amplifier 222 of the measurer 220. The measurer 220 may include an impedance unit 221, the differential amplifier 222, and a comparator 223.

The impedance unit 221 may be configured to measure a current variation based on the impedance of the objects on the sensor mat 100. The impedance unit 221 may include a resistor less than the impedance of the object or a resistor and a capacitor less than the impedance of the object. The measured size of the impedance may be adjusted based the object type disposed on the seat, which has an effect on a phase difference and a change of gain of the voltage signal output from the impedance unit 221. The differential amplifier 222 may be configured to amplify a voltage applied to a plurality of terminals of the impedance unit 221. The voltage applied to the plurality of terminals of the impedance unit 221 may be an amount of voltage drop that occurs at the impedance unit 221. One terminal of the input side of the amplifier 220 may be electrically connected to an output terminal of the power supplier 210 and thus may be configured to receive the sinusoidal voltage from the power supplier 210.

The comparator 223 may include a voltage follower and the first electrode 110 and the second electrode 120 may have a similar potential. The comparator 223 may further include a passive element (e.g., a resistor) to provide a predetermined potential difference to the first electrode 110 and the second electrode 120. The operator 230 may include a first voltage biasing unit 231, an analog to digital converter (ADC) 232, a Fourier transformer 233, a temperature sensor 234, a first register 235, a second register 236, and an interface 237. The second voltage biasing unit 231 may be configured to re-bias a signal biased by the first voltage biasing unit 215 and may be configured to apply the signal to the measurer 220, to extract an AC component. For example, an output signal (see FIG. 4C) of the second voltage biasing unit 231 may include a voltage that amplifies the output signal of the impedance unit 221 and may re-bias based on about a 0V.

The ADC 232 may be configured to convert an analog AC signal generated by re-biasing the signal by the second voltage biasing unit 231 into the digital waveform signal (see FIG. 4D). The ADC 232 may be configured to include a voltage divider, a comparator, and a bit encoder. To apply the digital value generated by the bit encoder to the Fourier transformer 233, fitting the phase difference, the ADC 232 may be configured to receive the clock signal from the clock generator 211 which may include a reference of a phase and may use the received clock signal as a reference signal. The Fourier transformer 233 may be configured to transform the digital signal applied from the ADC 232 into a frequency domain. The Fourier transformer 233 may be configured to extract a first component and imaginary second (Img) component of the digital signal. The Fourier transformer 233 may be implemented as fast Fourier transform (FTT) or discrete Fourier transform (DFT). The present disclosure may obtain values of a first domain and second domain by performing the FFT on the digitalized voltage signal output from the ADC 232, and may thereby obtain the variation of the phase difference and the gain.

The temperature sensor 234 may be configured to measure the current peripheral temperature. A correction value based on the temperature may be stored in a storage medium, and therefore the temperature sensor 234 may be configured to transmit the correction value that corresponds to the current peripheral temperature measured to the Fourier transformer 233. The Fourier transformer 233 may be configured to utilize the correction value received from the temperature sensor 234 to correct a first value and imaginary second value of the extracted digital signal. In other words, the Fourier transformer 233 may be configured to adjust a distortion of the measured signal of the measurer 220 due to the temperature.

The first register 235 and the second register 236 may each be configured to store the first value and the second value output from the Fourier transformer 233. The first register 235 and the second register 236 may be configured to store a previous first value and second value until the next period before the next value is output from the Fourier transformer 233. The interface 237 may be configured to transmit the values stored in the first register 235 and the second register 236 to the controller 300. The interface 237 may be configured to perform serial communications that may include an inter-integrated circuit (I2C) and a serial peripheral interface (SPI) or may be configured to perform parallel communication in which each bit value is directly connected to the controller 300. In other words, the interface 237 may be implemented as a serial interface or a parallel interface.

The controller 300 may be configured to utilize the first value and the second value output from the operator 230 to estimate (e.g., classify) the objects disposed on the seat. For example, when the threshold range is set for each object as illustrated in FIG. 5, the controller 300 may be configured to analyze the first value and the second value of the signal measured by the impedance measurer 200 to estimate the object as any one of objects O1 to O5. The controller 300 may be implemented as micro control unit (MCU).

The controller 300 may be configured to periodically adjust the frequency and the gain of the AC power output from the power supplier 210. In other words, the controller 300 may be configured to operate the direct digital synthesizer 212 of the power supplier 210 to adjust the frequency of the AC power and operate the gain changer 214 to adjust the gain of the AC power. The controller 300 may be configured to periodically change the frequency and the gain of the AC power of the power supplier 210 to determine an operation state of the occupant classification apparatus based on the occurrence of abnormality due to the electromagnetic wave interference and the noise of the occupant classification apparatus.

Referring to FIG. 6, the controller 300 may be configured to change the frequency and the gain of the AC power to monitor the interference and the noise and when the abnormality does not occur, the controller may be configured to determine that the operation state of the occupant classification apparatus is normal (a). For example, the controller 300 may be configured to change the gain to monitor the electromagnetic wave interference and the noise and may be configured to change the frequency to monitor the abnormal output due to the sudden change in temperature and humidity.

The controller 300 may be configured to change the frequency and the gain of power in the normal operation state to monitor the interference and the noise, to detect the abnormality of the occupant classification apparatus. For example, when the abnormal occurrence state is maintained for a predetermined period of time, the controller may be configured to determine the abnormal occurrence state as a temporary interference and noise state (b). When the operation state is changed to the temporary interference and noise state, the controller 300 may be configured to output a default value or a preliminary classification value as a classification value for the object. The controller 300 may be configured to periodically change the frequency and the gain of power even in the temporary interference and noise state to monitor the interference and the noise (d). The controller 300 may be configured to change the operation state from the temporary interference and noise state to the normal operation state when a predetermined period of time lapses without the occurrence of abnormality due to the interference and the noise (c). When the abnormality occurs notwithstanding that the frequency and the gain of power are not changed in the normal operation state or the temporary interference and noise state and a predetermined time lapses in this state, the controller 300 may be configured to change the operation state to the abnormal operation state (e, f).

Moreover, the controller 300 may be configured to change the frequency and the gain of power in the temporary interference and noise state to monitor the occurrence of abnormality due to the interference and the noise. Accordingly, as a result when the abnormality is continuously found and a predetermined period of time lapses in this state, the operation state may be changed to the abnormal operation state (f). When the operation state is changed to the abnormal operation state, the controller 300 may be configured to output warning information in a form that may be recognized by the user. The warning information may be output as any one of visual information, auditory information, and tactile information.

Figure 7:
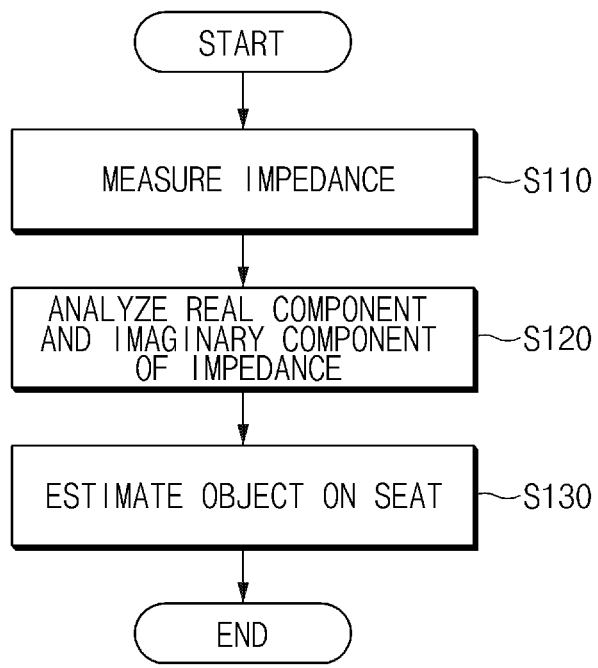
FIG. 7 is an exemplary flow chart illustrating an occupant classification method for a vehicle according to an exemplary embodiment of the present disclosure.

FIG. 7 is an exemplary flow chart illustrating an occupant classification method for a vehicle according to an exemplary embodiment of the present disclosure. The controller 300 may be configured to measure the impedance of the objects disposed on the upper surface of the seat using the sensor mat 100 mounted on the seat by the impedance measurer 200 (S110). For example, the impedance measurer 200 may use a scheme of measuring impedance using Fourier transform. The controller 300 may be configured to analyze the first component and the second component of the measured impedance output from the impedance measurer 200 (S120). The controller 300 may be configured to estimate the objects disposed on the seat by analysis of the first component and the second component of the measured impedance (S130).

According to the exemplary embodiments of the present disclosure, the output signal in the time domain may be converted into the frequency domain using the Fourier transform to extract the specific bandwidth, thereby analyzing each frequency band. Therefore, according to the exemplary embodiments of the present disclosure, the electromagnetic wave interference and the noise may more easily be sensed. Further, according to the exemplary embodiments of the present disclosure, the upper and lower electrodes of the sensor mat may have similar potential to sense the objects disposed on the upper surface of the seat. Further, according to the exemplary embodiments of the present disclosure, the varying scheme of monitoring whether the interference and the noise occur by changing the frequency and the gain of the input power based on the fail-safe logic may be used, thereby configuring various fail-safe logics to be more robust against the interference and the noise than the fixed gain or the fixed frequency scheme.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. An occupant classification apparatus for a vehicle, comprising:
   a sensor mat mounted at each seat in the vehicle to sense objects disposed on the seats;
   an impedance measurer configured to measure a current based on impedance of the object using the sensor mat, and to extract a first component and a second component from the measured current by converting the measured current into a frequency domain by Fourier transform; and
   a controller configured to analyze the first component and the second component output by the impedance measurer and estimate the object that corresponds to the analyzed result.

2. The occupant classification apparatus according to claim 1, wherein the impedance measurer includes:
   a power supplier configured to generate AC power;
   a measurer configured to be applied with the AC power to measure the current based on the impedance of the object; and
   an operator configured to convert a signal measured by the measurer into a frequency domain by Fourier transform to operate a first value and a second value of the measured signal.

3. The occupant classification apparatus according to claim 2, wherein the power supplier includes:
   a clock generator configured to generate a clock signal;
   a direct digital synthesizer configured to generate a digital waveform signal based on the clock signal;
   a digital-to analog converter configured to convert the digital waveform signal into an analog waveform signal;
   a gain changer configured to adjust a gain of the analog waveform signal; and
   a first voltage biasing unit configured to apply a bias voltage to an analog waveform signal output from the gain changer.

4. The occupant classification apparatus according to claim 2, wherein the measurer includes:
   an impedance unit configured to measure the current based on the impedance of the object;
   a differential amplifier configured to amplify a voltage applied to a plurality of terminals of the impedance unit; and
   a comparator configured to form a first electrode and a second electrode of the sensor mat at the same potential.

5. The occupant classification apparatus according to claim 4, wherein the comparator includes a voltage follower.

6. The occupant classification apparatus according to claim 2, wherein the operator includes:
   a second voltage biasing unit configured to re-bias a signal biased by a first voltage biasing unit to extract an AC component;
   an analog to digital converter configured to convert the analog signal re-biased by the second voltage biasing into the digital waveform signal;
   a Fourier transformer configured to transform the digital waveform signal into a frequency domain;
   a first register configured to store a first output from the Fourier transformer;
   a second register configured to store a second output from the Fourier transformer; and
   an interface configured to transmit the first value and the second value stored in the first register and the second register to the controller.

7. The occupant classification apparatus according to claim 6, wherein the operator further includes:
   a temperature sensor measuring current peripheral temperature, the Fourier transformer is configured to adjust a distortion of the first value and the second value based on the peripheral temperature.

8. The occupant classification apparatus according to claim 6, wherein the Fourier transformer is implemented as fast Fourier transform.

9. The occupant classification apparatus according to claim 6, wherein the Fourier transformer is implemented as discrete Fourier transform.

10. The occupant classification apparatus according to claim 2, wherein the controller is configured to periodically adjust a frequency and a gain of the AC power to monitor occurrence of abnormality due to electromagnetic wave interference and noise to adjust an operation state.

11. The occupant classification apparatus according to claim 10, wherein the operation state at least one selected from the group consisting of: a normal operation state, a temporary interference and noise state, and an abnormal operation state.

12. The occupant classification apparatus according to claim 11, wherein the controller is configured to output a default value or a preliminary classification value as a classification value for the object, when the operation state is in the temporary interference and noise state.

13. The occupant classification apparatus according to claim 1, wherein the sensor mat includes a first electrode and a second electrode disposed to overlap each other in a vertical direction to generate an electric field via alternating current (AC) power.

14. The occupant classification apparatus according to claim 13, wherein the first electrode and the second electrode are formed of the same shape and material.

15. The occupant classification apparatus according to claim 13, wherein the first electrode and the second electrode are formed of different shapes and materials.

\* \* \* \* \*